US010359221B2

(12) United States Patent
Lee et al.

(10) Patent No.: US 10,359,221 B2
(45) Date of Patent: Jul. 23, 2019

(54) WORKING FLUID OUTPUT DEVICE FOR TEMPERATURE CONTROL SYSTEM

(71) Applicant: MPI CORPORATION, Chu-Pei (TW)

(72) Inventors: Yueh-Ying Lee, Chu-Pei (TW); Helge Jacob Krystad, Chu-Pei (TW); Ying-Chiao Chang, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 789 days.

(21) Appl. No.: 14/883,481

(22) Filed: Oct. 14, 2015

(65) Prior Publication Data
US 2016/0169429 A1 Jun. 16, 2016

(30) Foreign Application Priority Data

Oct. 15, 2014 (TW) .............................. 103135700 A
Oct. 1, 2015 (TW) .............................. 104132453 A

(51) Int. Cl.
*F25B 45/00* (2006.01)
*G01R 31/28* (2006.01)
*G01R 31/00* (2006.01)

(52) U.S. Cl.
CPC ............ *F25B 45/00* (2013.01); *G01R 31/003* (2013.01); *G01R 31/2817* (2013.01); *G01R 31/2849* (2013.01); *G01R 31/2874* (2013.01)

(58) Field of Classification Search
CPC ......... F16L 37/08; F16L 37/12; F16L 37/123; F16L 37/127; F16L 37/18; F16L 37/20; F16L 37/0841; F16L 37/0847

USPC .............. 285/305, 308, 309, 312, 20, 19, 18
See application file for complete search history.

(56) References Cited

U.S. PATENT DOCUMENTS

| | | | | |
|---|---|---|---|---|
| 779,479 A * | 1/1905 | Howell | ............... | F16L 37/0841 285/317 |
| 784,848 A * | 3/1905 | Fullipp | ............... | F16L 37/0841 285/317 |
| 792,074 A * | 6/1905 | Rathburn | ............ | F16L 37/0841 220/300 |
| 1,287,385 A * | 12/1918 | Martin | ............... | F16L 37/0841 285/317 |

(Continued)

FOREIGN PATENT DOCUMENTS

AU 444864 9/1972
TW 200844356 A 11/2008
(Continued)

*Primary Examiner* — Aaron M Dunwoody
(74) *Attorney, Agent, or Firm* — Muncy, Geissler, Olds & Lowe, P.C.

(57) ABSTRACT

A working fluid output device for a temperature control system includes an output head, a fitting module and a quick release mechanism. A bottom plate of the output head and a top plate of the fitting module each have an installing surface and a through hole. The quick release mechanism has first and second units disposed on the two installing surfaces, respectively. The first unit includes an operable member having a positioning portion and configured to be operated by a user to move the positioning portion move between lock and unlocked positions to enable that the first unit is detachably coupled with the second unit and the fitting module is detachably attached to the output head in a way that the installing surfaces face each other and the through holes communicate with each other.

28 Claims, 12 Drawing Sheets

(56) References Cited

U.S. PATENT DOCUMENTS

| | | | | |
|---|---|---|---|---|
| 4,195,865 A | * | 4/1980 | Martin | F16L 11/18 |
| | | | | 285/18 |
| 5,447,343 A | * | 9/1995 | Gajewski | F16L 37/0841 |
| | | | | 285/308 |
| 6,547,284 B2 | * | 4/2003 | Rose | F16L 37/56 |
| | | | | 285/1 |
| 2001/0054818 A1 | * | 12/2001 | Fujikawa | F16L 29/007 |
| | | | | 285/18 |
| 2004/0171916 A1 | * | 9/2004 | Brommersma | F16L 37/0841 |
| | | | | 600/162 |
| 2007/0120361 A1 | * | 5/2007 | Kao | F16L 37/0841 |
| | | | | 285/308 |
| 2007/0209716 A1 | * | 9/2007 | Rankin | F16K 37/0033 |
| | | | | 137/554 |
| 2010/0282329 A1 | * | 11/2010 | Keller | F16L 37/1225 |
| | | | | 137/15.08 |
| 2012/0211107 A1 | * | 8/2012 | Haunhorst | F16L 37/0841 |
| | | | | 137/614.06 |
| 2016/0341348 A1 | * | 11/2016 | Lyon | F16L 37/0841 |

FOREIGN PATENT DOCUMENTS

| | | |
|---|---|---|
| TW | 200936901 A | 9/2009 |
| TW | M467809 U | 12/2013 |
| TW | I495752 B | 8/2015 |
| TW | M508562 U | 9/2015 |

* cited by examiner

WORKING FLUID OUTPUT DEVICE FOR TEMPERATURE CONTROL SYSTEM

BACKGROUND OF THE INVENTION

1. Field of the Invention

The present invention relates to temperature control systems and more particularly, to a working fluid output device for a temperature control system.

2. Description of the Related Art

In a task of testing electronic elements or electronic devices composed of electronic elements, such as wafers, integrated circuits, printed circuits, and so on, a tolerance temperature test or a thermal cycle test for a device under test (hereinafter referred to as the "DUT") is one of important tests. This means the DUT has to be tested at various temperatures to learn whether the DUT can be functionally run throughout a specific temperature range. Therefore, a temperature control system is required in the aforesaid testing process to control the ambient temperature of the DUT to a target temperature as accurately as possible. In a conventional temperature control system, a temperature control device capable of adjusting temperature of a working fluid (liquid or gas), such as a refrigeration and air condition device, is used to provide the working fluid at a specific temperature, and a working fluid output device is used to direct the working fluid to the surrounding of a DUT so as to adjust the temperature of the DUT.

Taiwan Patent Publication No. 200936901 discloses a conventional working fluid output device, which includes an output head substantially shaped as an elongated shell, and a protect cover detachably fixed to the bottom of the output head. The working fluid provided by the aforesaid temperature control device is directed into the protect cover that is covered on the DUT through the output head, so that the temperature in the surrounding of the DUT can be quickly changed by the working fluid. The protect cover is provided at the top thereof with an annular groove having a conical surface. The output head is provided at the bottom thereof with a protruded ring, and three bolts penetrating through the protruded ring and abutted against the annular groove, so that the protect cover is fixed to the output head.

When the abovementioned working fluid output device undergoes maintenance, or the inside thereof needs to be cleaned, or the protect cover has to be replaced by another fitting module, the protect cover has to be detached from the bottom of the output head. However, it consumes much time to rotate the bolts upon removing and installing the protect cover. Besides, when installing the protect cover, the user can't quickly observe whether the bolts are fastened tightly, but has to confirm the tightening condition of the bolts by rotating the bolts with hands. If the bolts are not fastened tightly, the protect cover is liable to fall down, thereby damaged. The protect cover is usually composed of glass pipes and metal components, thereby having a certain weight. However, when removing and installing the protect cover, the user can support the protect cover with only one hand because the other hand has to rotate the bolts; in such unsafe situation, the protect cover stands at the risk of falling down and being damaged.

In another conventional working fluid output device, the protect cover is fixed to the output head by a threaded nozzle and a nut. The nozzle is extended from the bottom of the output head into the protect cover by penetrating through a top plate of the protect cover. The nut is screwingly threaded onto the nozzle, so that the top plate of the protect cover is fixed between the output head and the nut. However, when removing and installing the protect cover of the aforesaid working fluid output device, the user has to use specific tools, thereby consuming time and labor. If the tools are used improperly, the glass pipes of the protect cover are liable to be damaged.

In addition, when the working fluid has a very low temperature, it may cause the protect cover frosting or dewing at the inner wall or other locations of the protect cover, thereby affecting the operation of the temperature control system or damaging the DUT placed in the protect cover.

SUMMARY OF THE INVENTION

The present invention has been accomplished in view of the above-noted circumstances. It is an objective of the present invention to provide a working fluid output device for a temperature control system, wherein a fitting module, such as a protect cover, connected with an output head can be removed and installed quickly, safely and conveniently.

To attain the above objective, the present invention provides a working fluid output device for a temperature control system comprising an output head, a fitting module, and a quick release mechanism. The output head has a bottom plate provided with an installing surface and a through hole at the installing surface. The fitting module has a top plate provided with an installing surface and a through hole at the installing surface. The quick release mechanism has a first unit disposed on one of the two installing surfaces, and a second unit disposed on the other one of the two installing surfaces. The first unit includes an operable member provided with a positioning portion and configured to be operated by a user to move the positioning portion between a locked position and an unlocked position to enable that the first unit is detachably coupled with the second unit and the fitting module is detachably attached to the output head in a way that the two installing surfaces face each other and the two through holes communicate with each other.

Preferably, the second unit includes a protrusion which is engaged with the positioning portion of the operable member when the positioning portion of the operable member is located at the locked position. When the positioning portion of the operable member is located at the unlocked position, the protrusion is disengaged with and detachable from the positioning portion of the operable member, thereby enabling the first unit and the second unit to be detached from each other.

The fitting module may be a protect cover or a box for covering a DUT, or a conveyor pipe for conveying the working fluid. By operating the operable member, the user can attach the fitting module to the output head and detach the fitting module from the output head very quickly. Therefore, the fitting module can be removed and installed quickly, safely and conveniently.

Preferably, the protrusion has a head portion and a body portion having a sectional area smaller than a sectional area of the head portion. The positioning portion of the operable member is configured as an elongated hole, which has a relatively larger-sized section and a relatively smaller-sized section communicating with the relatively larger-sized section. When the positioning portion is located at the locked position, the body portion of the protrusion is located at the relatively smaller-sized section that is smaller in size than the head portion of the protrusion, thereby preventing the protrusion from being separated from the operable member. When the positioning portion is located at the unlocked position, the relatively larger-sized section is passable by the head portion of the protrusion, thereby enabling the protrusion to be separated from the operable member. In this way, the quick release mechanism is easily manufactured and operated.

Preferably, the first unit of the quick release mechanism further includes at least one accommodating hole. When the positioning portion of the operable member is located at the locked position, the relatively smaller-sized section is located correspondingly to the accommodating hole and the head portion of the protrusion is positioned in the accommodating hole. When the positioning portion of the operable member is located at the unlocked position, the relatively larger-sized section is located correspondingly to the accommodating hole. In this way, the protrusion can be engaged with the operable member very firmly by the first unit.

Preferably, the first unit includes two accommodating holes which are respectively located by two opposite sides of the through hole that is located at the installing surface where the accommodating holes are located. The operable member has two positioning portions which are located correspondingly to the two accommodating holes respectively. The second unit includes two protrusions which are located correspondingly to the two accommodating holes respectively. In this way, the first and second units are connected with each other more firmly, resulting in that the fitting module is less possibly separated from the output head.

Preferably, a distance between one of the two protrusions and the through hole located on the installing surface where the two protrusions are located is unequal to a distance between the other one of the two protrusions and the through hole located on the installing surface where the two protrusions are located. This means the two protrusions are not located on the same imaginary circle concentric with the through hole, so that the fitting module can be prevented from being installed in incorrect direction.

Preferably, the first unit further includes a recess and a protruded portion, which are located at the installing surface where the first unit is located. The operable member is rotatably sleeved onto the protruded portion and located in the recess. In this way, the operable member is easily operated by the user.

Preferably, the recess has an opening located at a periphery of the installing surface where the recess is located, and the operable member has a push lever protruded out of the opening for user's turning the operable member by pushing the push lever. In this way, the operable member is more conveniently operated by the user. More preferably, a lock indicating mark and an unlock indicating mark are provided on the installing surface of the top plate of the fitting module, a lateral surface of the fitting module, or a housing of the output head; when the positioning portion of the operable member is located at the locked position, the push lever is located correspondingly to the lock indicating mark; when the positioning portion of the operable member is located at the unlocked position, the push lever is located correspondingly to the unlock indicating mark. In this way, the user can easily observe whether the fitting module is fixed to the output head.

Alternately, the recess has a plurality of openings located at a periphery of the installing surface where the recess is located; the operable member has a push lever and at least one indicating lever, which are protruded out of the openings respectively; a plurality of lock indicating marks and a plurality of unlock indicating marks are provided on the installing surface of the top plate of the fitting module, a lateral surface of the fitting module, or a housing of the output head; when the positioning portion of the operable member is located at the locked position, the push lever and the at least one indicating lever of the operable member are located correspondingly to the lock indicating marks respectively; when the positioning portion of the operable member is located at the unlocked position, the push lever and the at least one indicating lever of the operable member are located correspondingly to the unlock indicating marks respectively. In this way, the operable member is conveniently operated by the user; besides, as long as the user is located at positions where the user can see anyone of the push lever and the indicating lever, the user can quickly observe whether the fitting module is fixed to the output head.

Preferably, the indicating lever of the operable member or the whole operable member is made of metal so as to have high structural strength. Besides, the protrusion may also be made of metal so as to have high structural strength.

Preferably, the installing surface of the top plate of the fitting module has a positioning contour corresponding in shape to the bottom plate of the output head. In this way, the user doesn't need to see the bottom of the output head and only needs to align the positioning contour with the bottom plate of the output head to match the protrusion to the accommodating hole, so that the fitting module is more conveniently installed.

Preferably, the first unit further includes a positioning ball abutted against the operable member, and an elastic member abutted against the positioning ball for pushing the positioning ball toward the operable member; the operable member has two positioning holes; when the positioning portion is located at the locked position, the positioning ball is located at one of the two positioning holes; when the positioning portion is located at the unlocked position, the positioning ball is located at the other one of the two positioning holes. In this way, the user can positively perceive whether the positioning portion is moved to one of the locked position and the unlocked position, and the operable member will not be moved or rotated when receiving a slight external force.

Preferably, the output head is internally supplied with dry air, and the bottom plate of the output head has an air vent for the dry air in the output head to be vented from the air vent to pass through the quick release mechanism. In this way, the dry air can not only prevent the inside of the output head from frosting and dewing, but also prevent the quick release mechanism from frosting and dewing, so that the device doesn't need to consume additional energy to resolve the foresting and dewing problem of the quick release mechanism.

Preferably, the output head is internally supplied with dry air, and the bottom plate of the output head has an air vent; the top plate of the fitting module includes an upper board, a lower board, and a top-plate chamber located between the upper board and the lower board; the upper board has an air inlet communicating with the top-plate chamber and the air vent for the dry air in the output head to flow into the top-plate chamber through the air vent and the air inlet. In this way, the dry air can not only prevent the inside of the output head from frosting and dewing, but also prevent the inside of the fitting module from frosting and dewing, so that the device doesn't need to consume additional energy to resolve the frosting and dewing problem of the inside of the fitting module. More preferably, the dry air is heated before flowing into the top-plate chamber, so that the dry air can heat up the top plate, thereby not only preventing the inside of the fitting module from frosting and dewing more effectively, but also preventing the quick release mechanism from frosting and dewing at the same time.

Preferably, the fitting module further includes two pipes fixed to the lower board, and a pipe chamber located between the two pipes; the lower board has an air outlet communicating with the pipe chamber and the top-plate chamber for the dry air in the top-plate chamber to flow into the pipe chamber through the air outlet. For example, the two pipes are glass pipes which construct a protect cover with the top plate. The dry air can also prevent the two pipes from frosting and dewing.

Preferably, the fitting module may have a main body, and the top plate is disposed on the main body. Besides, the fitting module has an air chamber located between the main body and the top plate, an air inlet located at the top plate and communicating with the air chamber for dry air to enter the air chamber through the air inlet, and an air outlet communicating with the air chamber for the dry air to be vented from the air outlet. In this way, providing the dry air to the air chamber located at the top of the fitting module can raise the temperature of the fitting module, thereby preventing the inside of the fitting module from frosting and dewing. Besides, before the dry air enters the air inlet, it may partially flow to the quick release mechanism, thereby preventing the quick release mechanism from frosting and dewing.

Preferably, the air outlet may be located at the top plate, so that the dry air will directly flow to the quick release mechanism after being vented from the air outlet. Alternatively, after being vented from the air outlet, the dry air may be arranged to indirectly flow to the quick release mechanism; for example, the dry air may flow to the quick release mechanism indirectly by directional conveyance. In this way, the present invention is more effective in preventing the quick release mechanism from frosting and dewing.

Preferably, the fitting module may have a sealing member disposed between the main body and the top plate and around the air chamber, so that the dry air in the air chamber will be mostly vented from the air outlet, thereby enhancing the effect of avoiding frost and dew.

Preferably, the main body of the fitting module may have at least one groove for forming the air chamber, and the air outlet is located above the groove. In this way, the dry air can be directed to the air outlet by the groove, thereby enhancing the effect of avoiding frost and dew.

More preferably, the at least one groove of the main body of the fitting module may include an inner groove, an outer groove concentric with the inner groove, and a connecting groove connecting the inner groove and the outer groove, and the fitting module has a plurality of air outlets located above the inner groove and the outer groove. In this way, the fitting module needs to be provided with only one air inlet, and the dry air can be directed to a large area very quickly through the inner, outer and connecting grooves and then be vented to each part of the quick release mechanism very quickly from the air outlets located above the inner and outer grooves, thereby enhancing the effect of avoiding frost and dew.

Preferably, the bottom plate of the output head may have an air-supplying hole located correspondingly to the air inlet of the fitting module, and the dry air is provided to the fitting module from the output head through the air-supplying hole.

Preferably, the dry air may be heated before flowing into the air chamber, thereby more effectively preventing the inside of the fitting module and the quick release mechanism from frosting and dewing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
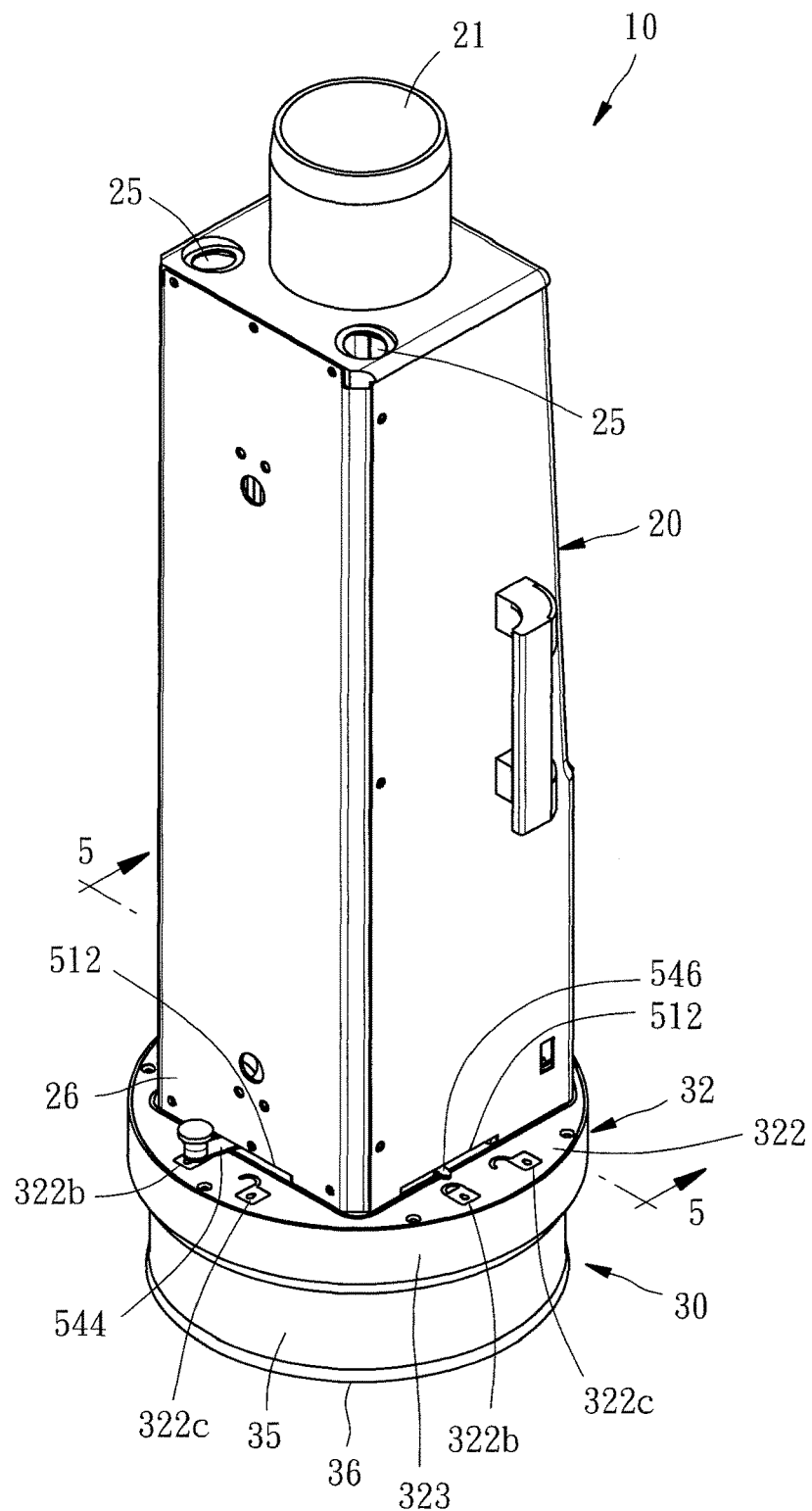
FIG. 1 is an assembled perspective view of a working fluid output device for a temperature control system according to a first preferred embodiment of the present invention.

First of all, it is to be mentioned that same reference numerals used in the following preferred embodiments and the appendix drawings designate same or similar elements throughout the specification for the purpose of concise illustration of the present invention. Besides, when it is mentioned that an element is attached to another element, it means that the former element is directly attached to the latter element, or the former element is indirectly attached to the latter element through one or more other elements between aforesaid former and latter elements.

Referring to FIGS. 1-5, a working fluid output device 10 for a temperature control system according to a first preferred embodiment of the present invention includes an output head 20, a fitting module 30, and a quick release mechanism 40. The quick release mechanism 40 includes a first unit 50 disposed on the bottom of the output head 20, and a second unit 60 disposed on the top of the fitting module 30. The fitting module 30 is detachably attached to the bottom of the output head 20 by the quick release mechanism 40. That is, the quick release mechanism 40 enables that the output head 20 and the fitting module 30 can be indirectly and detachably coupled with each other.

Figure 5:
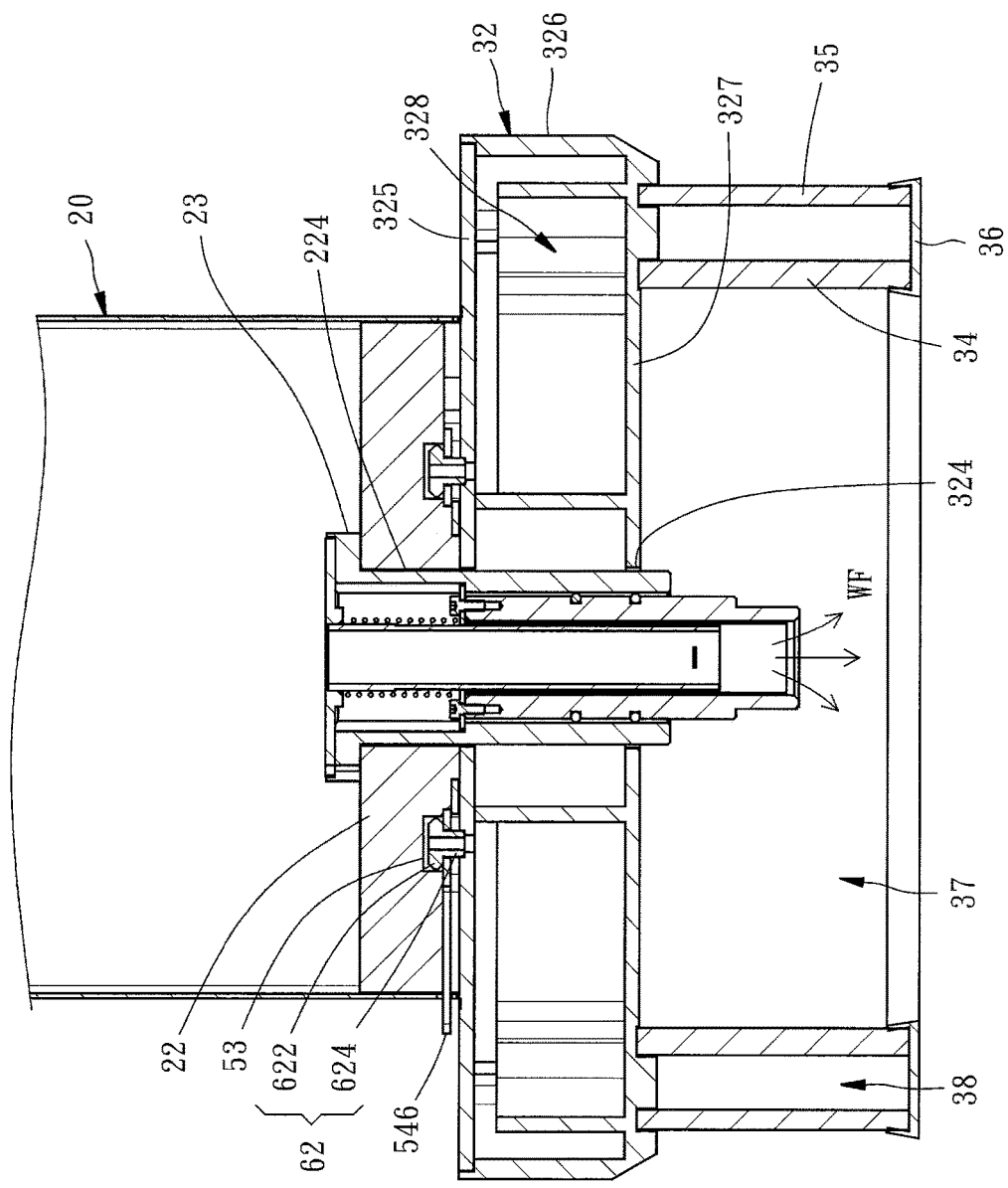
FIG. 5 is a sectional view taken along the line 5-5 in FIG. 1.

The output head 20 is similar to the conventional output head of prior art and shaped as an elongated shell. The output head 20 is provided at the top thereof with an entrance 21 for communicating with a temperature control device (not shown). The temperature control device, such as a refrigeration and air condition device, is adapted for providing a working fluid (liquid or gas) having a specific temperature. The working fluid is conveyed into the output head 20 through the entrance 21. The output head 20 has a bottom plate 22 which is provided with an installing surface 222, and a through hole 224 located at the installing surface 222. There may be a nozzle 23 fixed in the through hole 224. As shown in FIG. 5, through the nozzle 23, the working fluid WF supplied into the inside of the output head 20 is vented out of the output head 20.

The fitting module 30 has a top plate 32 which is provided with an installing surface 322, and a through hole 324 located at the installing surface 322. When the fitting module 30 is attached to the bottom of the output head 20, the two installing surfaces 222, 322 face each other, the two through holes 224, 324 communicate with each other, and the nozzle 23 passes through the through hole 324. In this embodiment, the top plate 32 is composed of an upper board 325 and a lower shell 326 which has a lower board 327 facing the upper board 325, and a top-plate chamber 328 located between the upper board 325 and the lower board 327. The through hole 324 is passed through the upper board 325 and the lower board 327. However, the top plate 32 may include only a single plate without such top-plate chamber 328.

In this embodiment, the fitting module 30 is a protect cover, which includes not only the top plate 32 but also two pipes 34, 35, e.g. two glass pipes, fixed to the lower board 327, and a silicon pad 36 fixedly connected to the two pipes 34, 35. An accommodating space 37 is defined in the pipe 34, and a pipe chamber 38 is defined between the two pipes 34, 35. The fitting module 30 is adapted to cover a DUT (not shown) in a way that the DUT is located in the accommodating space 37, such that the temperature of the DUT is adjustable by the working fluid vented from the output head 20. The top plate 32 of the fitting module 30 has two decompression holes 329 passed through the upper board 325 and the lower board 327. Each of the top and the bottom of the output head 20 also has two decompression holes 24, 25. The working fluid in the accommodating space 37 will flow back into the output head 20 through the decompression holes 329, 24, and be vented out of the output head 20 from the decompression holes 25 located at the top of the output head 20. However, the fitting module 30 is not limited to be such protect cover; for example, the fitting module 30 may be a conveyor pipe which is composed of the top plate 32 and a flexible tube for conveying the working fluid.

In this embodiment, the first unit 50 of the quick release mechanism 40 is disposed on the installing surface 222 of the output head 20, and the second unit 60 of the quick release mechanism 40 is disposed on the installing surface 322 of the fitting module 30. However, the first unit 50 may be disposed on the installing surface 322 of the fitting module 30, and the second unit 60 is disposed on the installing surface 222 of the output head 20.

The first unit 50 includes a recess 51, a protruded portion 52 and two accommodating holes 53, which are integrally formed on the installing surface 222, and an operable member 54 which is rotatably sleeved onto the protruded portion 52 and located in the recess 51. The amount of the accommodating holes 53 is unlimited. The two accommodating holes 53 are respectively located by two opposite sides of the through hole 224 which is located at the installing surface 222. The operable member 54 has a ring 542, and a push lever 544 and two indicating levers 546, which are extended from the ring 542, and two positioning portions 548 provided at the ring 542. The amount of the indicating levers 546 is unlimited. The amount of the positioning portions 548 of the operable member 54 is equal to the amount of the accommodating holes 53, and the positioning portions 548 are located correspondingly to the accommodating holes 53, respectively. Each positioning portion 548 is configured as an elongated hole, which penetrates through the ring 542 and has a relatively larger-sized section 548*a* and a relatively smaller-sized section 548*b* communicating with the relatively larger-sized section 548*a*. The recess 51 has three openings 512 located at a periphery of the installing surface 222. The push lever 544 and the indicating levers 546 of the operable member 54 are protruded out of the openings 512, respectively.

The second unit 60 includes two protrusions 62 protruded from the installing surface 322. The amount of the protrusions 62 is also equal to the amount of the accommodating holes 53, and the protrusions 62 are also located correspondingly to the accommodating holes 53, respectively. Each protrusion 62 has a head portion 622 and a body portion 624 having a sectional area smaller than a sectional area of the head portion 622, as shown in FIG. 5. The sectional area of the head portion 622 is a little smaller than the sectional area of the relatively larger-sized section 548*a* of the positioning portion 548 and much larger than the sectional area of the relatively smaller-sized section 548*b* of the positioning portion 548. The sectional area of the body portion 624 is a little smaller than the sectional area of the relatively smaller-sized section 548*b* of the positioning portion 548, so that the body portion 624 is slidable in the arc-shaped relatively smaller-sized section 548*b*.

Figure 6:
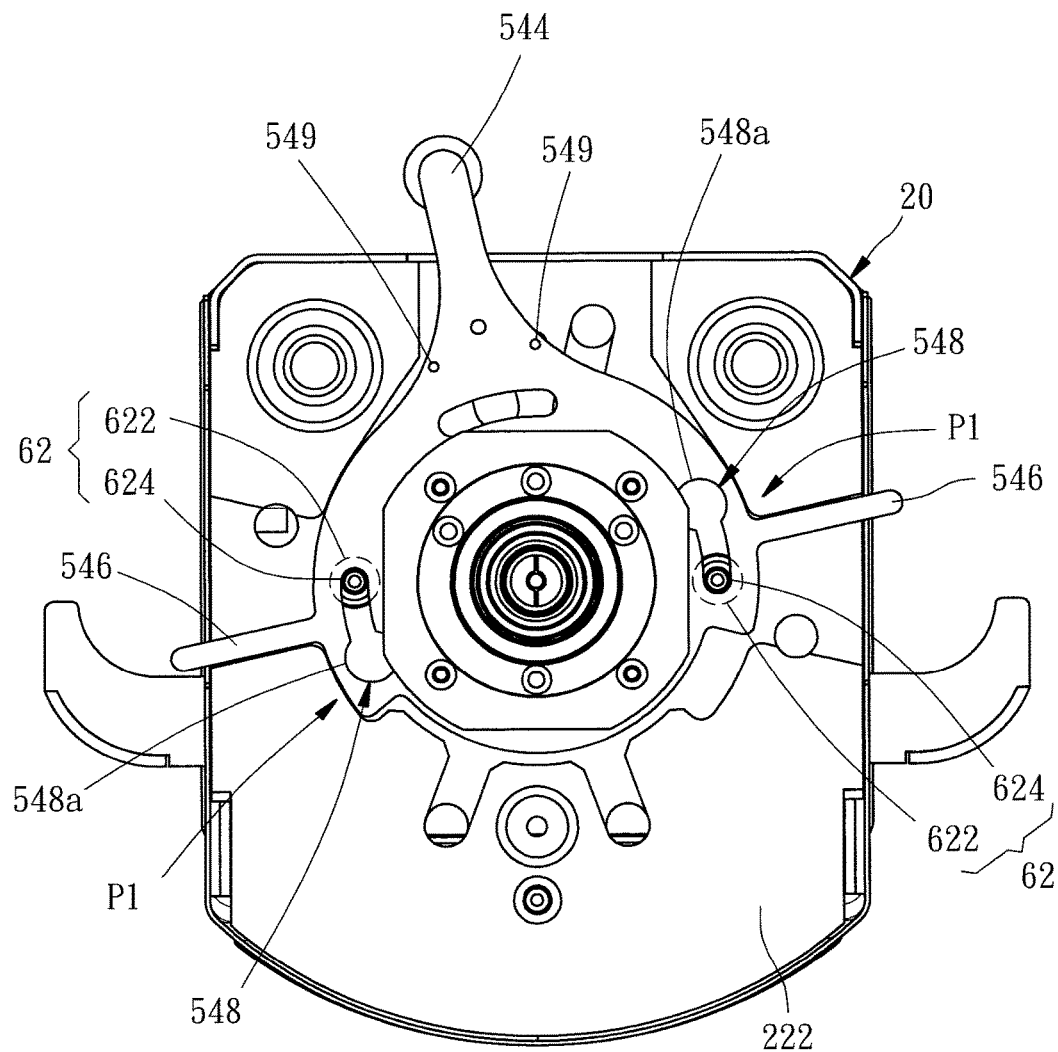
FIG. 6 is similar to FIG. 3, but further showing the second unit of the quick release mechanism.
Figure 7:
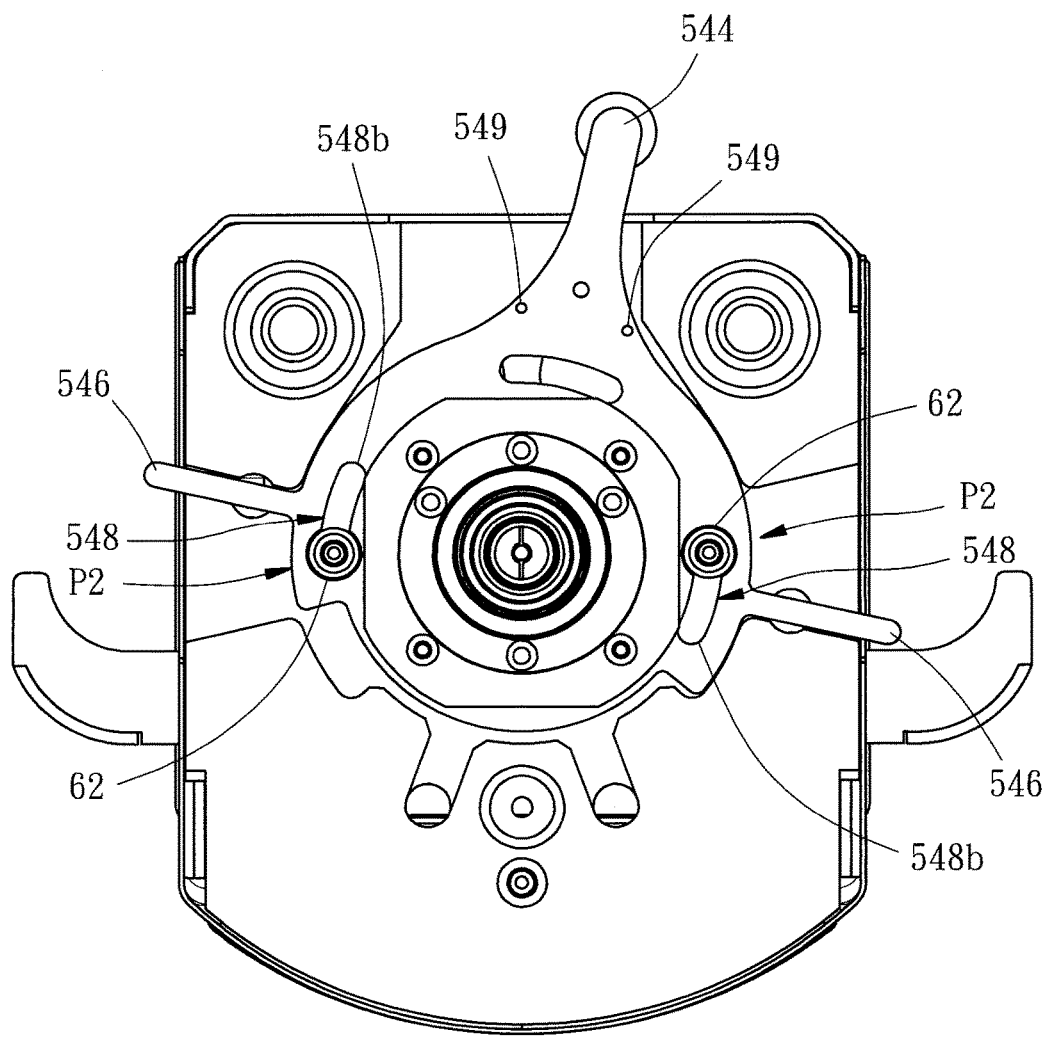
FIG. 7 is similar to FIG. 6; however, two positioning portions of an operable member of the quick release mechanism are located at a locked position in FIG. 6 but located at an unlocked position in FIG. 7.

Referring to FIGS. 6-7, the operable member 54 is adapted for being operated by a user in such a manner that the two positioning portions 548 reciprocally move between a locked position P1 and an unlocked position P2. In this embodiment, the operable member 54 is operated in a way that the user pushes the push lever 544 to rotate the operable member 54. During the process of user's installing the fitting module 30 on the bottom of the output head 20, the two positioning portions 548 are positioned at the unlocked position P2 at first, and then the fitting module 30 is attached to the bottom of the output head 20 in a way that the two protrusions 62 are passed through the relatively larger-sized sections 548*a* of the two positioning portions 548 of the operable member 54 respectively and inserted in the two accommodating holes 53 respectively; thereafter, the operable member 54 is operated to rotate to make the two positioning portions 548 move to the locked position P1.

When the positioning portions 548 of the operable member 54 are located at the locked position P1, the relatively smaller-sized sections 548*b* of the two positioning portions 548 are located correspondingly to the two accommodating holes 53 respectively, and the head portion 622 and the body portion 624 of each protrusion 62 are located in the corresponding accommodating hole 53 and relatively smaller-sized section 548b respectively. At this time, the two protrusions 62 are positioned in the two accommodating holes 53 respectively by the restriction of the two positioning portions 548, and the head portions 622 of the protrusions 62, which are located in the accommodating holes 53, are located correspondingly to the relatively smaller-sized sections 548b of the two positioning portions 548, which have a size smaller than that of the head portions 622 of the protrusions 62, so that the two protrusions 62 are unable to be separated from the two positioning portions 548 of the operable member 54. In this way, the fitting module 30 is fixed to the bottom of the output head 20 by means of the quick release mechanism 40.

When the operable member 54 is rotated to make the positioning portions 548 be located at the unlocked position P2, the relatively larger-sized sections 548a of the two positioning portions 548 are located correspondingly to the two accommodating holes 53 respectively and able to be passed by the head portions 622 of the protrusions 62. At this time, the protrusions 62 can be separated from or inserted into the accommodating holes 53. Therefore, when the two positioning portions 548 are located at the unlocked position P2, the fitting module 30 can be detached from the bottom of the output head 20 or installed to the bottom of the output head 20.

It is to be mentioned that the first unit 50 may have no such accommodating hole 53, as long as the first unit 50 has space for accommodating the head portion 622 of each protrusion 62 and each protrusion 62 can be engaged with the positioning portion 548 of the operable member 54. For example, the first unit 50 may be installed or structurally designed in a way that the positioning portion 548 of the operable member 54 is suspended above the recess 51 with a distance therebetween, so that the space located between the operable member 54 and the recess 51 can accommodate the head portion 622 of the protrusion 62. Besides, the design of the first and second units 50, 60 disclosed in this embodiment, wherein the first unit 50 has the rotary operable member 54 capable of being connected with and separated from the protrusion 62 of the second unit 60 to enable the output head 20 and the fitting module 30 to be connected and separated very quickly, is just provided as an exemplary embodiment for illustration of the present invention. This means the quick release mechanism 40 of the present invention, which is provided for connecting the output head 20 and the fitting module 30 of the working fluid output device 10, is not limited to that disclosed in this embodiment. The quick release mechanism 40 of the present invention may have different configuration from that disclosed in this embodiment, as long as it has first and second units which are disposed on the face-to-face installing surfaces 222, 322 of the output head 20 and the fitting module 30 and detachable from each other, enabling the fitting module 30 to be detachably attached to the output head 20 in a way that the two installing surfaces 222, 322 face each other and the two through holes 224, 324 communicate with each other. In addition, the first and second units are not limited to be connected and separated by rotating relative to each other, but maybe, for example, by linearly displacing relative to each other. In this embodiment, a distance between one of the two protrusions 62 and the through hole 324 located on the installing surface 322 where the two protrusions 62 are located is equal to a distance between the other one of the two protrusions 62 and the through hole 324, which means the two protrusions 62 are located on the same imaginary circle concentric with the through hole 324. Similarly, the two accommodating holes 53 are correspondingly located on the same imaginary circle concentric with the through hole 224. However, the distance between one of the two protrusions 62 and the through hole 324 located on the installing surface 322 where the two protrusions 62 are located may be unequal to the distance between the other one of the two protrusions 62 and the through hole 324, which means the two protrusions 62 may be located on different imaginary circles concentric with the through hole 324, so that the quick release mechanism 40 doesn't need additional mistake-proofing design for preventing the fitting module 30 from being installed in incorrect direction.

Figure 2:
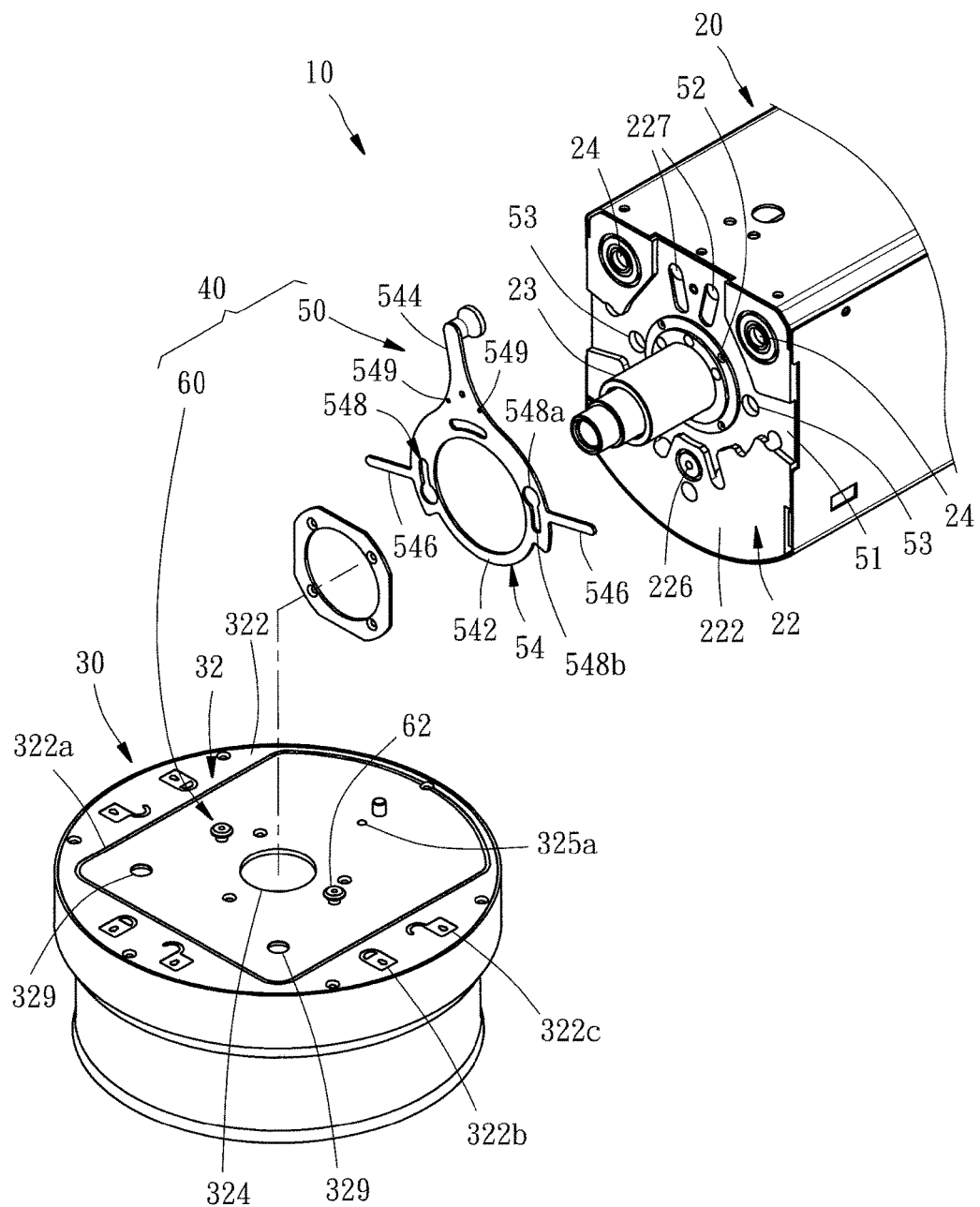
FIG. 2 is an exploded perspective view of the working fluid output device for the temperature control system according to the first preferred embodiment of the present invention.

As shown in FIG. 2, the installing surface 322 of the fitting module 30 may, but not limited to, have a positioning contour 322a shaped correspondingly to the bottom plate 22 of the output head 20. In this way, when installing the fitting module 30 to the bottom of the output head 20, the user doesn't need to see the bottom of the output head 20 and only needs to align the positioning contour 322a with the bottom plate 22 of the output head 20 to match the two protrusions 62 to the two accommodating holes 53, respectively.

By handling the operable member 54, the user can attach the fitting module 30 to the output head 20 and detach the fitting module 30 from the output head 20 very quickly. Besides, the user can individually support the fitting module 30 by two hands and handle the operable member 54 at the same time. The optimum way of operation is putting one hand adjacent to the push lever 544 and the other hand located at opposite side of the hand adjacent to the push lever 544, using the thumb of said the other hand to press the installing surface 322 and four fingers of each hand to buckle the bottom of the fitting module 30, and then pushing the push lever 544 by the thumb of the hand adjacent to the push lever 544. Therefore, the fitting module 30 can be removed and installed quickly, safely and conveniently.

It is to be mentioned that the operable member of the present invention is not limited to the type that the operable member rotates when handled by the user, and the positioning portion of the operable member is not limited to the elongated hole and may be the hole with other shapes or other non-hole configuration capable of engagement, as long as the operable member can perform a specific motion, which is rotation in this embodiment but may also be displacement, when being handled by the user and the positioning portion can be moved along with the motion of the operable member to selectively fix the position of the protrusion. Although the positioning portion and the protrusion having specific configuration design are provided in the embodiment of the present invention, but they may be varied or modified according to the operating principle of the present invention by the person skilled in the art without departing from the spirit and scope of the present invention, and such variations and modifications should be included within the scope of the present invention.

As shown in FIG. 2, the installing surface 322 of the fitting module 30 may, but not limited to, be provided with a plurality of lock indicating marks 322b and a plurality of unlock indicating marks 322c. When the two positioning portions 548 are located at the locked position P1, the push lever 544 and the indicating levers 546 of the operable member 54 are located correspondingly to the lock indicating marks 322b respectively; for example, at this time, the push lever 544 is located on a lock indicating mark 322b and each indicating lever 546 is pointed towards a lock indicating mark 322b. When the two positioning portions 548 are located at the unlocked position P2, the push lever 544 and the indicating levers 546 of the operable member 54 are located correspondingly to the unlock indicating marks 322c respectively. In this way, as long as the user is located at any position where the user can see the push lever 544 or anyone of the indicating levers 546, the user can easily observe whether the fitting module 30 is fixed to the output head 20. The lock indicating marks 322b and the unlock indicating marks 322c are not limited to be provided on the installing surface 322 of the fitting module 30. For example, the lock indicating marks 322b and the unlock indicating marks 322c may be provided on a lateral surface 323 of the top plate 32 of the fitting module 30 or a housing 26 of the output head 20.

Figure 8:
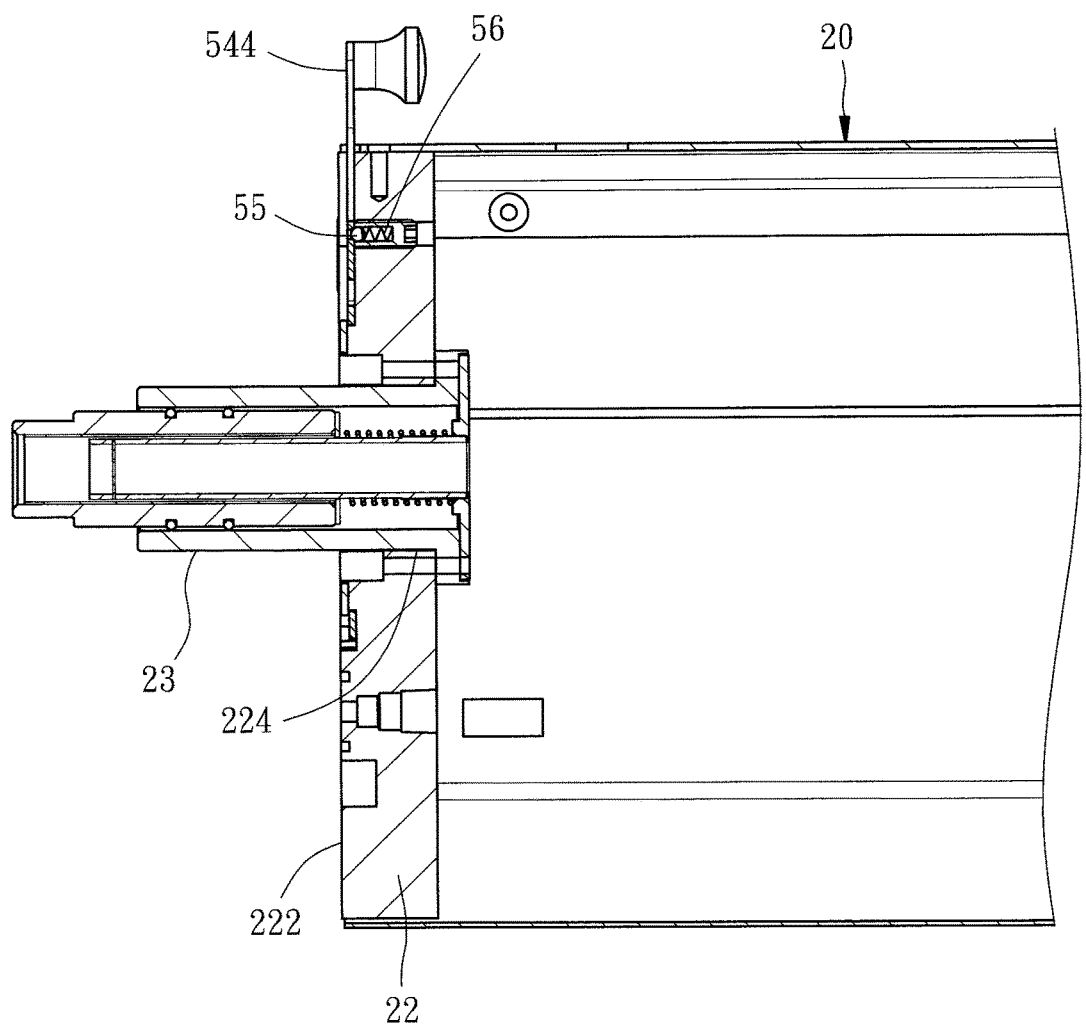
FIG. 8 is a sectional view taken along the line 8-8 in FIG. 3.

Referring to FIG. 2 and FIG. 8, the first unit 50 of the quick release mechanism 40 may, but not limited to, further includes a positioning ball 55 abutted against the operable member 54, and an elastic member 56, such as coil spring, abutted against the positioning ball 55 for pushing the positioning ball 55 toward the operable member 54. Besides, the operable member 54 has two positioning holes 549 for cooperation with the positioning ball 55 to perform positioning effect. When the two positioning portions 548 are located at the locked position P1, the positioning ball 55 is located at one of the two positioning holes 549, i.e. the positioning hole 549 at the right side as shown in FIG. 6. When the two positioning portions 548 are located at the unlocked position P2, the positioning ball 55 is located at the other one of the two positioning holes 549, i.e. the positioning hole 549 at the left side as shown in FIG. 7. Through the vibration and the sound of the positioning ball 55 entering the positioning hole 549, the user can positively perceive whether the two positioning portions 548 are moved to one of the locked position P1 and the unlocked position P2. Besides, resulted from the slight engagement between the positioning ball 55 and the positioning hole 549, the operable member 54 will not be moved or rotated when receiving a slight external force.

Because the working fluid output device 10 may receive and output the working fluid having a very low temperature, the inside of the output head 20 should be prevented from frosting and dewing. Therefore, dry air with low dew point may be used to serve as the working fluid to keep the inside of the output head 20 dry. The dry air is optimal to have dew point lower than 0° C. For example, the air having the dew point of −60° C. may be used as the dry air in this embodiment so as to achieve good effect. The present invention may, but not limited to, have the features mentioned in the following content to keep the inside of the fitting module 30 and the space between the fitting module 30 and the output head 20 dry, so that the device 10 doesn't need to consume additional energy to prevent the inside of the fitting module 30 and the quick release mechanism 40 from frosting and dewing.

Figure 3:
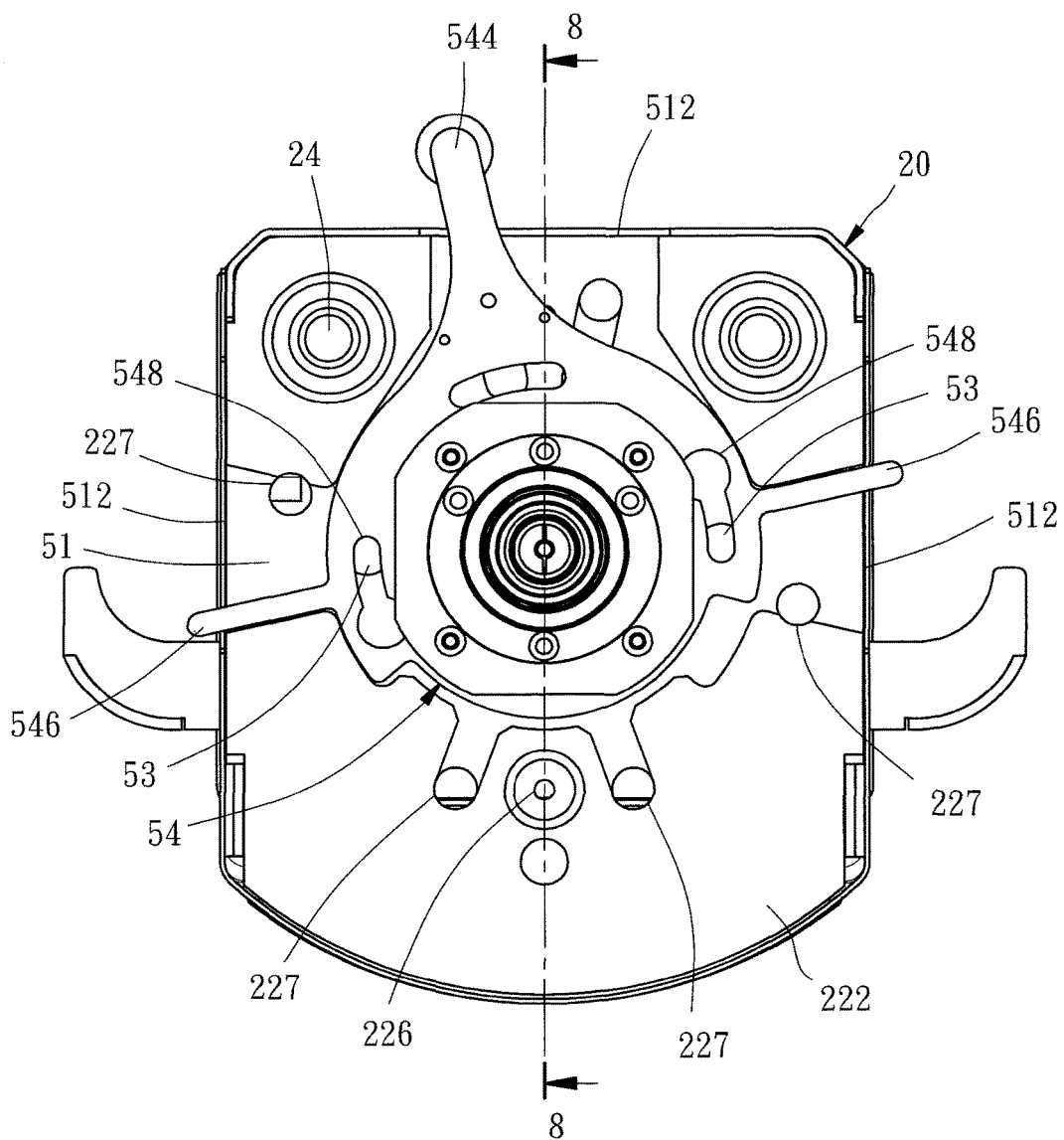
FIG. 3 is a bottom view of an output head and a first unit of a quick release mechanism of the working fluid output device for the temperature control system according to the first preferred embodiment of the present invention.
Figure 4:
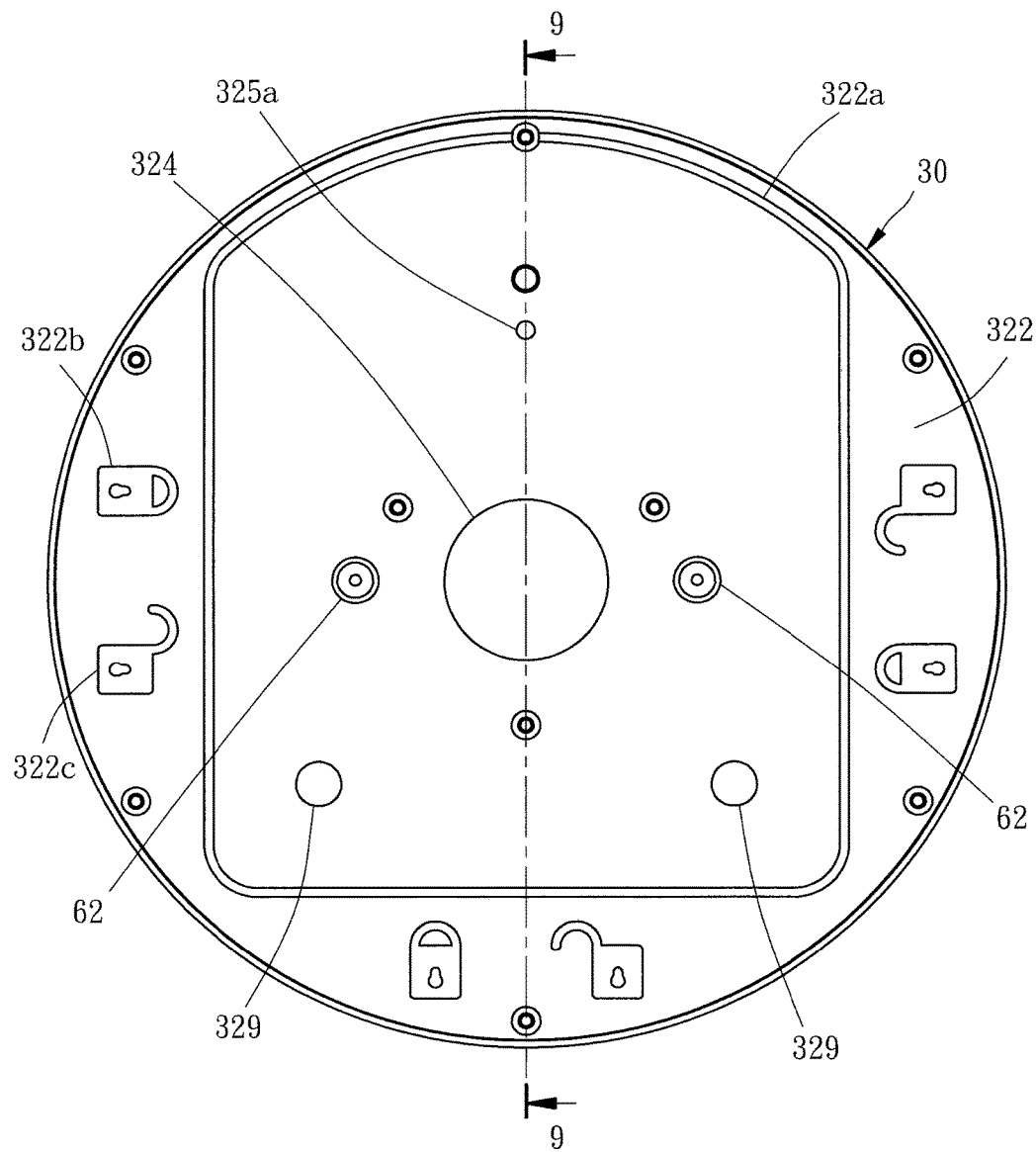
FIG. 4 is a top view of a fitting module and a second unit of the quick release mechanism of the working fluid output device for the temperature control system according to the first preferred embodiment of the present invention.
Figure 9:
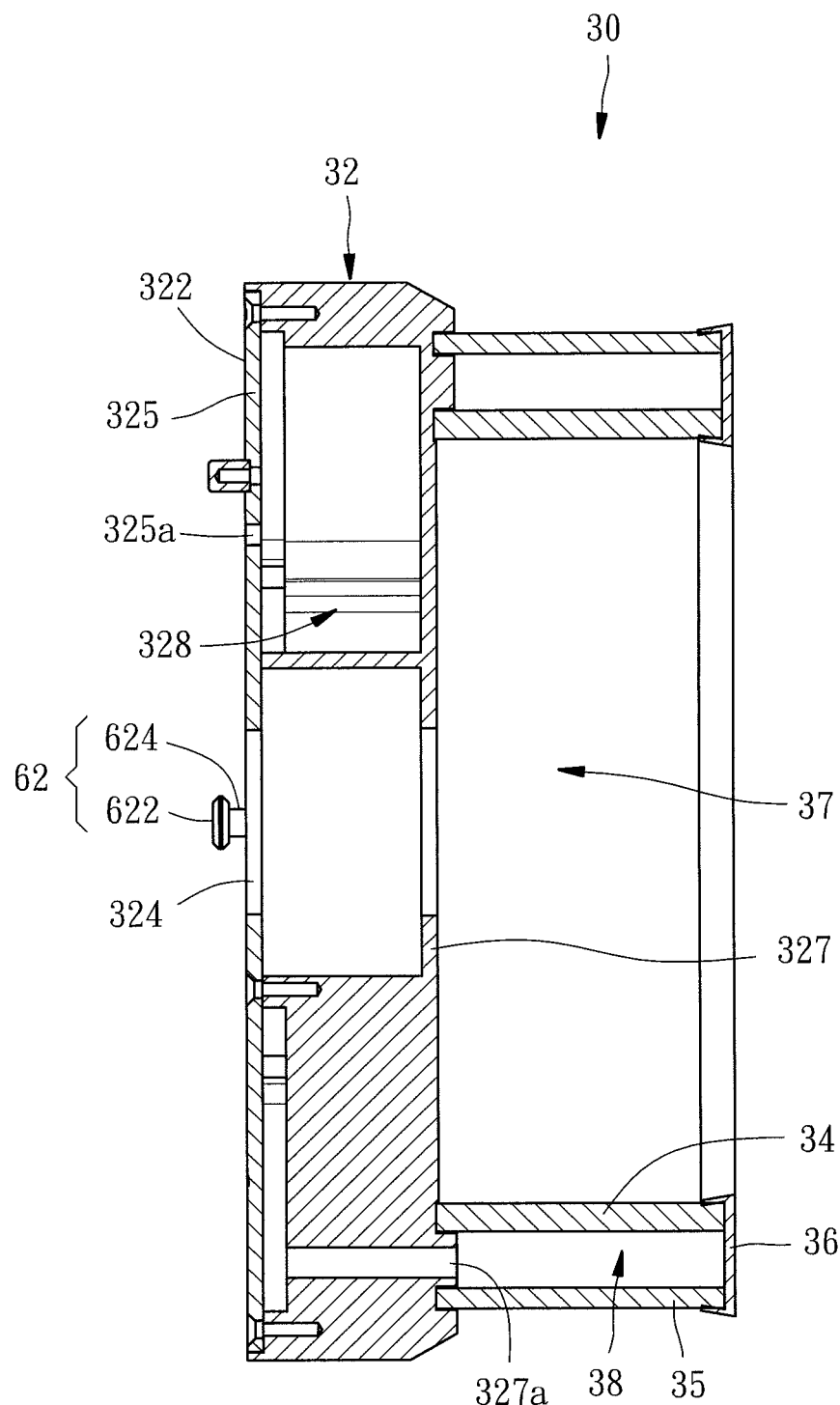
FIG. 9 is a sectional view taken along the line 9-9 in FIG. 4.

Referring to FIGS. 2, 3 and 9, the upper board 325 has an air inlet 325a communicating with the top-plate chamber 328, and the lower board 327 has an air outlet 327a communicating with the pipe chamber 38 and the top-plate chamber 328. Besides, the bottom plate 22 of the output head 20 has an air vent 226 communicating with the air inlet 325a, and six air vents 227 facing the installing surface 322. The dry air in the output head 20 is vented from the air vents 227 to pass through the quick release mechanism 40 so as to prevent the quick release mechanism 40 from frosting and dewing. The dry air in the output head 20 also flows into the top-plate chamber 328 through the air vent 226 and the air inlet 325a, and further flows into the pipe chamber 38 through the air outlet 327a, so as to prevent the top-plate chamber 328 and the pipe chamber 38 from frosting and dewing. Alternately, an individual air pipe (not shown) may be attached to the fitting module 30 for providing dry air into the top-plate chamber 328 from the outside of the device 10.

There may be an air heating module disposed inside or outside the output head 20 to heat the dry air in the output head 20 or the dry air provided to the fitting module from the outside of the output head 20 before the dray air flows into the top-plate chamber 328. For example, the dry air can be heated to 60-80° C. before flowing into the top-plate chamber 328. In this way, the dry air can heat up the top plate 32, thereby preventing the inside of the fitting module 30 from frosting and dewing more effectively; at the same time, the dry air can also heat up the surrounding of the quick release mechanism 40, thereby preventing the quick release mechanism 40 from frosting and dewing even though the dry air may not flow by the quick release mechanism 40. Particularly, the whole operable member 54 or only the indicating levers 546 thereof, and the protrusions 62 are preferably made of metal, so that the quick release mechanism 40 has high structural strength. Because metal has usually good thermal conductivity, it is liable to be frosted and dewed under low temperature. By the aforesaid heating way and the good heat conductivity of metal, the problem of frosting and dew can be solved effectively.

Figure 10:
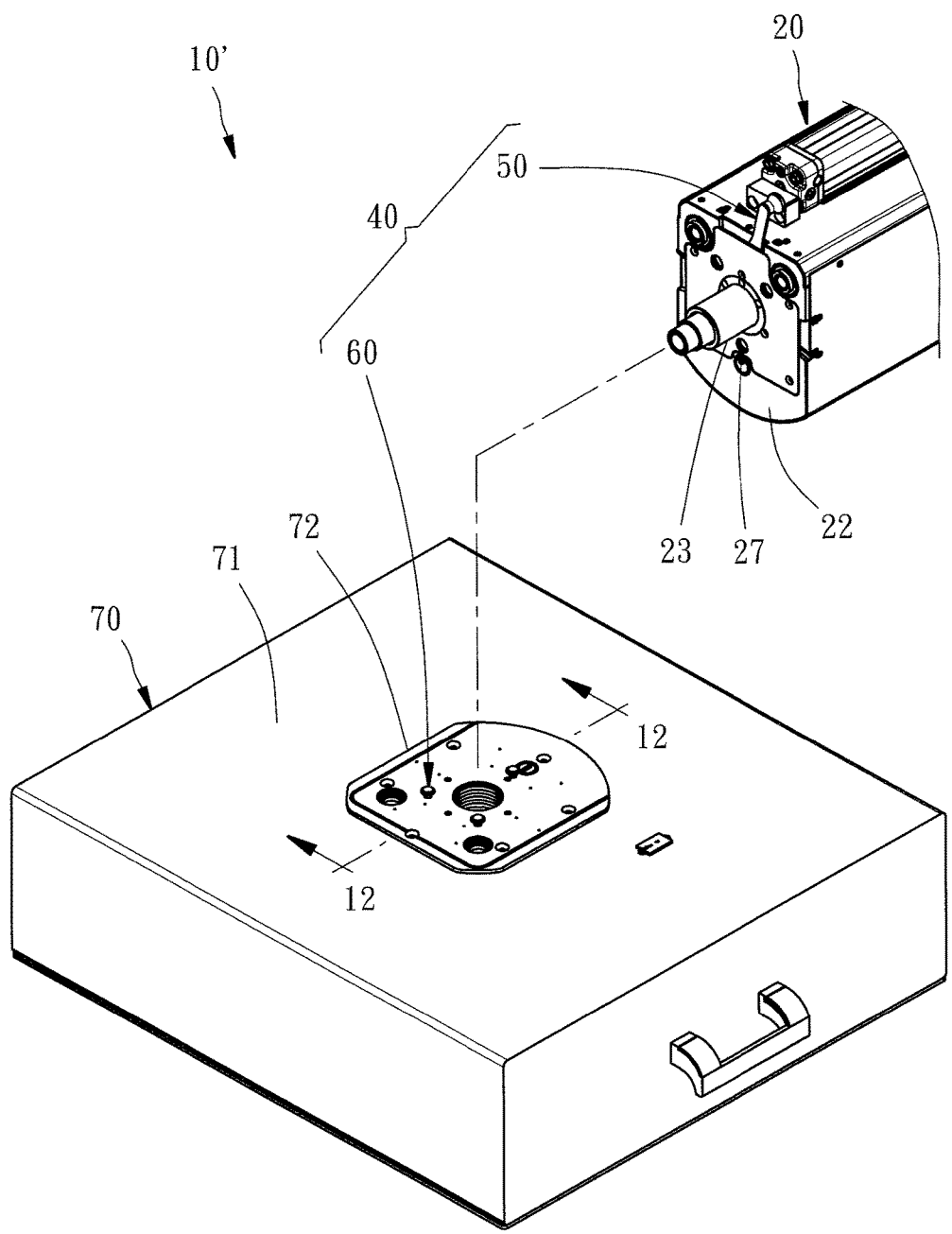
FIG. 10 is an exploded perspective view of a working fluid output device for a temperature control system according to a second preferred embodiment of the present invention.
Figure 11:
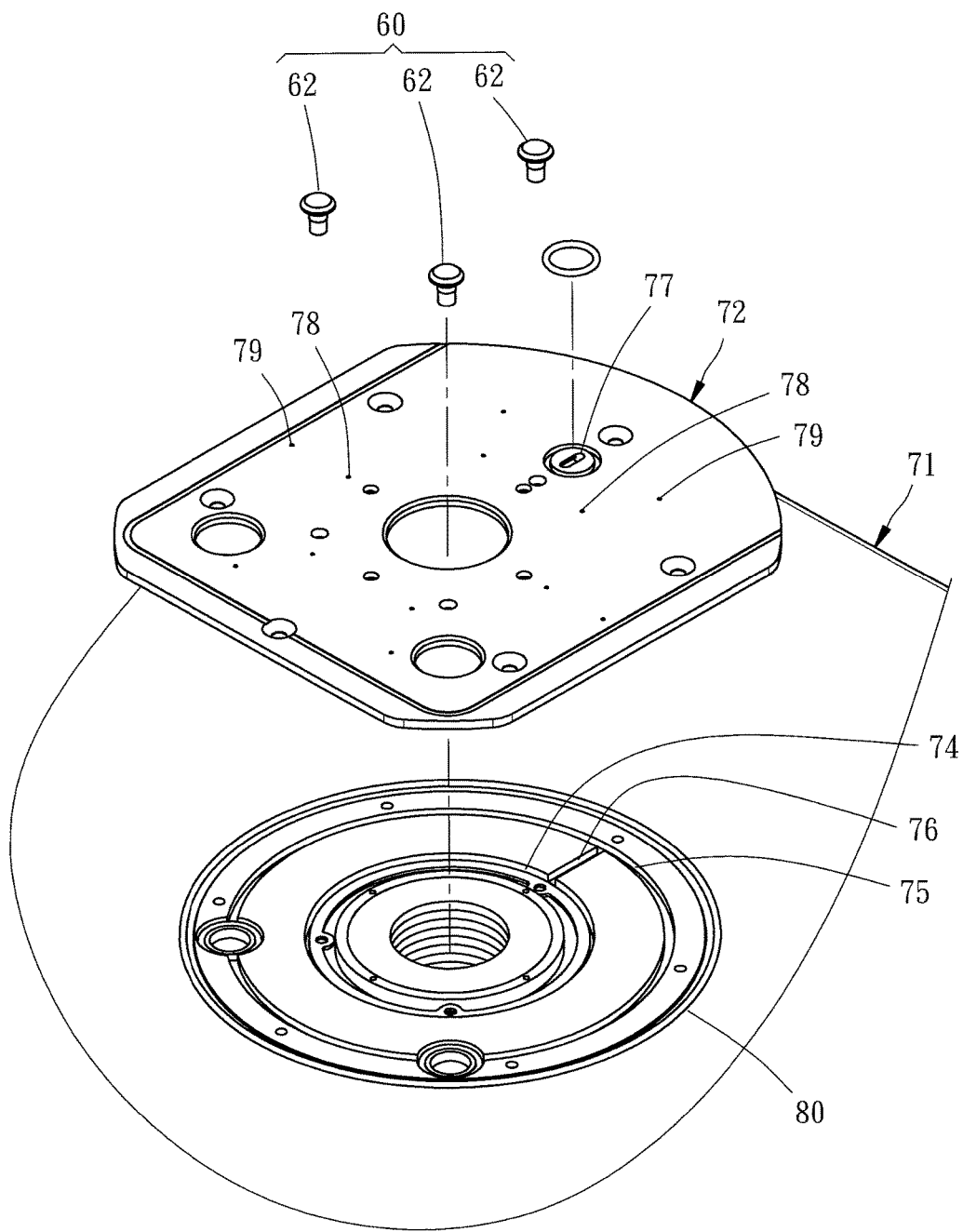
FIG. 11 is an exploded perspective view of a fitting module and a second unit of a quick release mechanism of the working fluid output device for the temperature control system according to the second preferred embodiment of the present invention.
Figure 12:
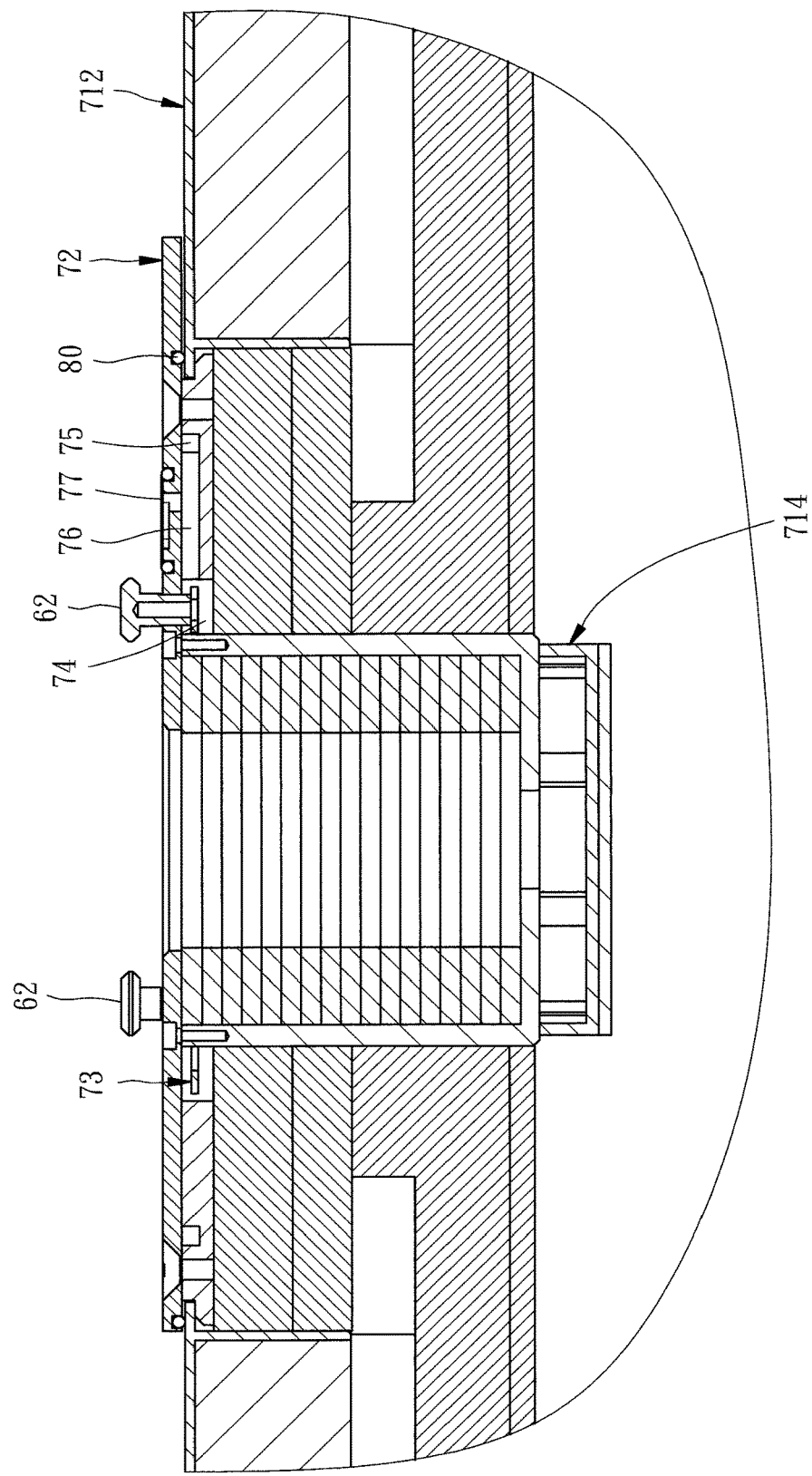
FIG. 12 is a sectional view taken along the line 12-12 in FIG. 10.

Alternatively, the heated or unheated dry air can also be arranged to flow through the quick release mechanism 40, as disclosed in a working fluid output device 10' according to a second preferred embodiment of the present invention as shown in FIGS. 10-12. The output head 20 and the quick release mechanism 40 of the working fluid output device 10' of this embodiment are similar to those of the aforesaid first preferred embodiment. However, the fitting module 70 in this embodiment primarily includes a main body 71, and a top plate 72 disposed on the main body 71. The main body 71 includes a box 712 which is composed of a plurality of components and adapted to cover the DUT, and a coupling unit 714 which is attached to the top of the box 712, composed of a plurality of components and adapted to be coupled with the nozzle 23 of the output head 20. The box 712 and the coupling unit 714 are less related to the technical features of the present invention, thereby not specified in detail here.

As shown in FIG. 12, the fitting module 70 has an air chamber 73 located between the main body 71 and the top plate 72. The air chamber 73 may, but not limited to, be formed by at least one groove provided at the main body 71. As shown in FIG. 11, the at least one groove of the main body 71 of the fitting module 70 in this embodiment includes an inner groove 74, an outer groove 75 concentric with the inner groove 74, and a connecting groove 76 connecting the inner groove 74 and the outer groove 75. Besides, the fitting module 70 is provided at the top plate 72 with an air inlet 77, a plurality of air outlets 78 located above the inner groove 74 and facing the first unit 50, and a plurality of air outlets 79 located above the outer groove 75 and facing the first unit 50. The air inlet and outlets 77, 78, 79 are arranged to communicate with the air chamber 73 for the heated or unheated dry air to enter the air chamber 73 through the air inlet 77 and then flow to the quick release mechanism 40 through the air outlets 78, 79. In this embodiment, the output head 20 is provided therein with an air heating module (not shown), and the bottom plate 22 of the output head 20 has an air-supplying hole 27 (as shown in FIG. 10) located correspondingly to the air inlet 77. The dry air is provided to the fitting module 70 from the output head 20 through the air-supplying hole 27. However, the dry air may not be provided from the output head 20, but provided by an individual dry-air-supplying device.

In this way, providing the dry air to the air chamber 73 located at the top of the fitting module 70 can raise the temperature of the fitting module 70, thereby preventing the inside of the fitting module 70 from frosting and dewing. Besides, the dry air can further flow to the quick release mechanism 40 through the air outlets 78, 79, thereby also preventing the quick release mechanism 40 from frosting and dewing. In addition, using the grooves to direct the dry air to the air outlets can further improve the effect of avoiding frost and dew. In particular, with the groove design of this embodiment, the fitting module 70 needs to be provided with one air inlet 77 only, and can direct the dry air to a large area very quickly through the inner, outer and connecting grooves 74, 75, 76 and then vent the dry air to each part of the quick release mechanism 40 very quickly from the air outlets 78, 79 located above the inner and outer grooves 74, 75, thereby more effectively enhancing the effect of avoiding frost and dew. Besides, the fitting module 70 may, but not limited to, have a sealing member 80, such as an O-ring, which is disposed between the main body 71 and the top plate 72 and around the air chamber 73 for preventing the dry air in the air chamber 73 from being vented from the edge of the top plate 72. In this way, the dry air is mostly kept in the air chamber 73 or vented from the air outlets 78, 79, thereby more effectively enhancing the effect of avoiding frost and dew. However, the assembly of the sealing member 80, the main body 71 and the top plate 72 may be designed in a way that a small part of the dry air can be leaked out from the sealing member 80 to flow to the edge of the top plate 72 so as to keep the edge of the top plate 72 dry.

As described above, the dry air in the air chamber 73 is not limited to be vented directly to the quick release mechanism 40, as long as the dry air is vented out of the air chamber 73. Therefore, the air outlet of the fitting module 70 is not limited to be located at the top plate 72, but may be located at other positions. Alternatively, the gap between the sealing member 80 and the main body 71 and the gap between the sealing member 80 and the top plate 72 may serve as the air outlet to vent the dry air out of the air chamber 73. The working fluid output device of the present invention may be designed in a way that the dry air is partially flow to the quick release mechanism 40 before entering the air chamber 73, or designed in another way that the dry air in the air chamber 73 flows to the quick release mechanism 40 indirectly by conveyance.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A working fluid output device for a temperature control system, comprising:
    an output head, through which a working fluid is vented out, the output head having a bottom plate provided with an installing surface and a through hole at the installing surface;
    a fitting module having a top plate and an accommodating space, the top plate being provided with an installing surface and a through hole at the installing surface of the top plate, the accommodating space being configured to receive a device under test such that a temperature of the device under test is adjustable by the working fluid vented from the output head; and
    a quick release mechanism having a first unit disposed on one of the two installing surfaces and a second unit disposed on the other one of the two installing surfaces, the first unit comprising an operable member that is provided with a positioning portion and configured to be operated by a user to move the positioning portion between a locked position and an unlocked position to enable that the first unit is detachably coupled with the second unit and the fitting module is detachably attached to the output head in a way that the two installing surfaces face each other and the two through holes communicate with each other;
    wherein the top plate of the fitting module comprises an upper board, a lower board, and a top-plate chamber located between the upper board and the lower board, and the top-plate chamber is supplied with dry air.

2. The working fluid output device as claimed in claim 1, wherein the second unit comprises a protrusion engaged with the positioning portion of the operable member when the positioning portion of the operable member is located at the locked position; when the positioning portion of the operable member is located at the unlocked position, the protrusion is disengaged with and detachable from the positioning portion of the operable member, thereby enabling the first unit and the second unit to be detached from each other.

3. The working fluid output device as claimed in claim 2, wherein the protrusion has a head portion and a body portion having a sectional area smaller than a sectional area of the head portion; the positioning portion of the operable member is configured as an elongated hole, which has a relatively larger-sized section and a relatively smaller-sized section communicating with the relatively larger-sized section; when the positioning portion is located at the locked position, the body portion of the protrusion is located at the relatively smaller-sized section that is smaller in size than the head portion of the protrusion, thereby preventing the protrusion from being separated from the operable member; when the positioning portion is located at the unlocked position, the relatively larger-sized section is passable by the head portion of the protrusion, thereby enabling the protrusion to be separated from the operable member.

4. The working fluid output device as claimed in claim 3, wherein the first unit of the quick release mechanism further comprises at least one accommodating hole; when the positioning portion of the operable member is located at the locked position, the relatively smaller-sized section is located correspondingly to the at least one accommodating hole and the head portion of the protrusion is positioned in the at least one accommodating hole; when the positioning portion of the operable member is located at the unlocked position, the relatively larger-sized section is located correspondingly to the at least one accommodating hole.

5. The working fluid output device as claimed in claim 4, wherein the first unit comprises two accommodating holes which are respectively located by two opposite sides of the through hole that is located at the installing surface where the two accommodating holes are located; the operable member has two positioning portions which are located correspondingly to the two accommodating holes respectively; the second unit comprises two protrusions which are located correspondingly to the two accommodating holes respectively.

6. The working fluid output device as claimed in claim 5, wherein a distance between one of the two protrusions and the through hole located on the installing surface where the two protrusions are located is unequal to a distance between the other one of the two protrusions and the through hole located on the installing surface where the two protrusions are located.

7. The working fluid output device as claimed in claim 1, wherein the first unit further comprises a recess and a protruded portion, which are located at the installing surface where the first unit is located; the operable member is rotatably sleeved onto the protruded portion and located in the recess.

8. The working fluid output device as claimed in claim 7, wherein the recess has an opening located at a periphery of the installing surface where the recess is located; the operable member has a push lever protruded out of the opening for the user's turning the operable member by pushing the push lever.

9. The working fluid output device as claimed in claim 8, wherein a lock indicating mark and an unlock indicating mark are provided on the installing surface of the top plate of the fitting module, a lateral surface of the fitting module, or a housing of the output head; when the positioning portion of the operable member is located at the locked position, the push lever is located correspondingly to the lock indicating mark; when the positioning portion of the operable member is located at the unlocked position, the push lever is located correspondingly to the unlock indicating mark.

10. The working fluid output device as claimed in claim 7, wherein the recess has a plurality of openings located at a periphery of the installing surface where the recess is located; the operable member has a push lever and at least one indicating lever, which are protruded out of the plurality of openings respectively; a plurality of lock indicating marks and a plurality of unlock indicating marks are provided on the installing surface of the top plate of the fitting module, a lateral surface of the fitting module, or a housing of the output head; when the positioning portion of the operable member is located at the locked position, the push lever and the at least one indicating lever of the operable member are located correspondingly to the lock indicating marks respectively; when the positioning portion of the operable member is located at the unlocked position, the push lever and the at least one indicating lever of the operable member are located correspondingly to the unlock indicating marks respectively.

11. The working fluid output device as claimed in claim 1, wherein the operable member is made of metal.

12. The working fluid output device as claimed in claim 1, wherein the installing surface of the top plate of the fitting module has a positioning contour corresponding in shape to the bottom plate of the output head.

13. The working fluid output device as claimed in claim 1, wherein the first unit further comprises a positioning ball abutted against the operable member, and an elastic member abutted against the positioning ball for pushing the positioning ball toward the operable member; the operable member has two positioning holes; when the positioning portion is located at the locked position, the positioning ball is located at one of the two positioning holes; when the positioning portion is located at the unlocked position, the positioning ball is located at the other one of the two positioning holes.

14. The working fluid output device as claimed in claim 1, wherein the output head is internally supplied with the dry air, and the bottom plate of the output head has at least one air vent for the dry air in the output head to be vented from the at least one air vent to pass through the quick release mechanism.

15. The working fluid output device as claimed in claim 1, wherein the output head is internally supplied with the dry air, and the bottom plate of the output head has an air vent; the upper board has an air inlet communicating with the top-plate chamber and the air vent for the dry air in the output head to flow into the top-plate chamber through the air vent and the air inlet.

16. The working fluid output device as claimed in claim 15, wherein the fitting module further comprises two pipes fixed to the lower board, and a pipe chamber located between the two pipes; the lower board has an air outlet communicating with the pipe chamber and the top-plate chamber for the dry air in the top-plate chamber to flow into the pipe chamber through the air outlet.

17. The working fluid output device as claimed in claim 15, wherein the dry air is heated before flowing into the top-plate chamber.

18. The working fluid output device as claimed in claim 1, wherein the fitting module further comprises two pipes fixed to the lower board, and a pipe chamber located between the two pipes; the lower board has an air outlet communicating with the pipe chamber and the top-plate chamber for the dry air in the top-plate chamber to flow into the pipe chamber through the air outlet.

19. The working fluid output device as claimed in claim 1, wherein the dry air is heated before flowing into the top-plate chamber.

20. The working fluid output device as claimed in claim 1, wherein the first unit is disposed on the installing surface of the bottom plate, and the second unit is disposed on the installing surface of the top plate.

21. A working fluid output device for a temperature control system, comprising:
  an output head, through which a working fluid is vented out, the output head having a bottom plate provided with an installing surface and a through hole at the installing surface;
  a fitting module having a top plate and an accommodating space, the top plate being provided with an installing surface and a through hole at the installing surface of the top plate, the accommodating space being configured to receive a device under test such that a temperature of the device under test is adjustable by the working fluid vented from the output head; and
  a quick release mechanism having a first unit disposed on one of the two installing surfaces and a second unit disposed on the other one of the two installing surfaces, the first unit comprising an operable member that is provided with a positioning portion and configured to be operated by a user to move the positioning portion between a locked position and an unlocked position to enable that the first unit is detachably coupled with the second unit and the fitting module is detachably attached to the output head in a way that the two installing surfaces face each other and the two through holes communicate with each other;
  wherein the fitting module has a main body, and the top plate is disposed on the main body; the fitting module has an air chamber located between the main body and the top plate, an air inlet located at the top plate and communicating with the air chamber for dry air to enter the air chamber through the air inlet, and an air outlet communicating with the air chamber for the dry air to be vented from the air outlet.

22. The working fluid output device as claimed in claim 21, wherein the air outlet is located at the top plate.

23. The working fluid output device as claimed in claim 21, wherein the dry air is arranged to flow to the quick release mechanism after being vented from the air outlet.

24. The working fluid output device as claimed in claim 21, wherein the fitting module has a sealing member disposed between the main body and the top plate and around the air chamber.

25. The working fluid output device as claimed in claim 21, wherein the main body of the fitting module has at least one groove for forming the air chamber, and the air outlet is located above the at least one groove.

26. The working fluid output device as claimed in claim 25, wherein the at least one groove of the main body of the fitting module comprises an inner groove, an outer groove concentric with the inner groove, and a connecting groove connecting the inner groove and the outer groove; the fitting module has a plurality of said air outlets located above the inner groove and the outer groove.

27. The working fluid output device as claimed in claim 21, wherein the bottom plate of the output head has an air-supplying hole located correspondingly to the air inlet of the fitting module; the dry air is provided to the fitting module from the output head through the air-supplying hole.

28. The working fluid output device as claimed in claim 21, wherein the dry air is heated before flowing into the air chamber.

* * * * *